US009985237B2

(12) United States Patent
Zhang et al.

(10) Patent No.: US 9,985,237 B2
(45) Date of Patent: May 29, 2018

(54) METHOD OF MANUFACTURING AN ORGANIC LIGHT EMITTING DIODE BY LIFT-OFF

(75) Inventors: Dong Zhang, Shanghai (CN); Sang Sool Koo, Sarawak (MY)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 532 days.

(21) Appl. No.: 13/389,888

(22) PCT Filed: Aug. 12, 2009

(86) PCT No.: PCT/EP2009/060461
§ 371 (c)(1),
(2), (4) Date: Apr. 16, 2012

(87) PCT Pub. No.: WO2011/018110
PCT Pub. Date: Feb. 17, 2011

(65) Prior Publication Data
US 2012/0193646 A1    Aug. 2, 2012

(51) Int. Cl.
*H01L 21/84* (2006.01)
*H01L 51/52* (2006.01)
*H01L 51/00* (2006.01)

(52) U.S. Cl.
CPC ...... *H01L 51/5203* (2013.01); *H01L 51/0021* (2013.01)

(58) Field of Classification Search
CPC .................. H01L 51/5203; H01L 51/0021
See application file for complete search history.

(56) References Cited

U.S. PATENT DOCUMENTS

| | | | | |
|---|---|---|---|---|
| 4,564,997 A | * | 1/1986 | Matsuo | H01L 21/0272 148/DIG. 131 |
| 7,144,486 B1 | * | 12/2006 | Fritsch | G01N 27/403 204/400 |
| 2001/0019245 A1 | * | 9/2001 | Ohshita | H01L 27/3281 313/506 |
| 2002/0072139 A1 | * | 6/2002 | Kashiwabara | 438/29 |
| 2004/0084412 A1 | * | 5/2004 | Waldfried | G03F 7/427 216/67 |
| 2006/0082286 A1 | * | 4/2006 | Kawaguchi et al. | 313/503 |
| 2006/0091793 A1 | | 5/2006 | Baude et al. | |
| 2006/0180815 A1 | | 8/2006 | Sarma et al. | |
| 2006/0228877 A1 | * | 10/2006 | Kamijima | G11B 5/1278 438/597 |
| 2007/0072392 A1 | * | 3/2007 | Ooseki et al. | 438/455 |
| 2009/0061724 A1 | * | 3/2009 | Cok | H01L 51/5234 445/58 |
| 2009/0140418 A1 | * | 6/2009 | Li | H01L 21/02126 257/734 |
| 2009/0322923 A1 | * | 12/2009 | Maehara | 348/308 |

OTHER PUBLICATIONS

PCT, International Search Report, International Application No. PCT/EP2009/060461 (dated Jul. 2, 2010, published Feb. 17, 2011).

* cited by examiner

*Primary Examiner* — Su C Kim
(74) *Attorney, Agent, or Firm* — Thompson Hine LLP

(57) ABSTRACT

A method of manufacturing an Organic Light Emitting Diode (OLED). The method comprises using a solution or a solvent for removing a photo-resist used for patterning, which photo-resist is at least partly covered with a material other than photo-resist. The method of manufacturing the OLED thus comprises a lift-off process. The new method provides the benefits of low cost manufacturing and high OLED performance.

7 Claims, 3 Drawing Sheets

METHOD OF MANUFACTURING AN ORGANIC LIGHT EMITTING DIODE BY LIFT-OFF

This application is a national stage filing of PCT International Application No. PCT/EP2009/060461, the entire contents of which are incorporated by reference herein.

The present invention relates to a method of fabricating an organic light emitting diode (OLED) on silicon integrated circuits, and in particular to fabricating the electrodes of the OLED and/or filling the gaps between the electrodes with dielectric material.

BACKGROUND

In recent years, many applications have been found for the integration of OLED with standard CMOS circuits, for example in near-to-eye lenses. The integration of OLED and CMOS into the same chip can provide many benefits, such as compact size, fast speed, low power consumption etc.

In a typical OLED on MOS structure for use as a display, a wafer (e.g. a silicon wafer) having an integrated circuit is provided. Metal pixels are photolithographically patterned on top of the wafer to serve as electrodes of the OLED and so as to form a reflective layer for reflecting the light from the OLED. An organic compound layer is then formed on top, covering the metal pixels as well as the gap(s) between the metal pixels.

However, the present inventors have appreciated that problems may arise since the standard CMOS process is not well suited to the integration of OLED on CMOS, for at least two reasons. Firstly, it is common to produce top metals with a certain roughness in a standard CMOS process. The root mean square of the roughness of the top metal produced in a standard CMOS process is commonly more than 5 nanometers. This is because a very smooth surface such as less than 3 nanometers is not required in the standard CMOS. But the rough surface of the top metal tends to lead to high leakage of the OLED devices. It is believed that non-standard processes could solve this problem. However, semiconductor foundries are generally reluctant to develop non-standard processes due to high development and production costs. Moreover, a typical Physical Vapor Deposition (PVD) tool is not purposely designed to produce metal with a very smooth surface. Secondly, the thickness of metals normally used in CMOS processes is about 8000 Å (800 nm) resulting in a pixel gap of comparable depth. OLED organic materials deposited in the pixel gap(s) can induce side wall emitting and high electrical fields at the metal edge. As a result, both the efficiency and reliability of the OLED device is degraded. To solve these problems, in the standard CMOS process, the pixel gap(s) is/are filled by insulating dielectric materials.

The inventors have found that a plasma etching process can be employed to remove the insulating materials from the top surface of the pixel electrodes. However, this results in increased complexity and additional cost. Moreover, there is the risk that the pixel metal surface may suffer plasma etching damage, resulting in increased roughness of the pixel electrode surface.

The inventors have appreciated that alternatively it is possible to employ non standard CMOS processes such as Chemical Vapor Deposition (CVD) to fill the pixel gap(s), chemical mechanical polishing to flatten the topology and etching back to remove any insulation materials from the top surface of the pixel electrodes. However, these non-standard CMOS processes will increase the production costs.

SUMMARY

It is an aim of at least preferred embodiments of the present invention to address one or both of the above problems whilst retaining the benefits of low cost and high OLED performance.

In some embodiments, it is an aim of the present invention to provide a new method of fabricating an OLED on integrated circuits, whereby photo-resist and material on top of the photo-resist, which material is the same as the material from which the pixel electrodes are made, are removed by applying a low complexity and low cost process without requiring any plasma etching. The new process eliminates the risk of plasma etching damage on the pixel electrode surface.

More specifically, it is an aim of at least preferred embodiments of the present invention to provide a new method of fabricating an OLED on integrated circuits, whereby insulating or dielectric material is deposited in the pixel gap(s) which reduces, preferably significantly reduces or eliminates altogether the pixel gap depth, and dielectric material over the pixel electrodes is removed by applying a low complexity and low cost process without requiring any plasma etching. Hence the risk of plasma etching damage on the pixel electrode surface can be avoided. Accordingly, the new process also improves the roughness of the pixel electrode surface when compared with the plasma etching technique.

Some embodiments of present invention disclose a low cost and low complexity manufacturing process for forming pixel electrodes on which OLED organic materials are to be deposited subsequently.

Accordingly, in a first aspect the present invention provides a method of forming an Organic Light Emitting Diode (OLED) wherein the method comprises using a solution for removing a photo-resist used for patterning, which photo-resist is at least partly covered with a material other than photo-resist.

According to a second aspect of the present invention there is provided a method of forming an Organic Light Emitting Diode (OLED) wherein the method comprises using a solvent for removing a photo-resist used for patterning, which photo-resist is at least partly covered with a material other than photo-resist.

According to a third aspect of the present invention, there is provided a method of forming an OLED wherein the method comprises a lift-off process.

According to a fourth aspect of the invention, there is provided an OLED manufactured according to the above method.

BRIEF DESCRIPTION OF THE DRAWINGS

Some preferred embodiments of the invention will now be described by way of example only and with reference to the accompanying drawings, in which.

DETAILED DESCRIPTION

Figure 1:
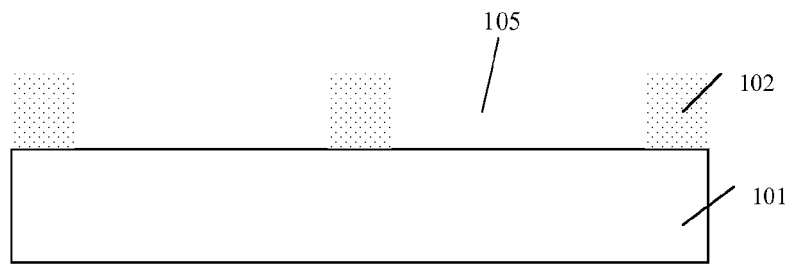
FIG. 1 shows a schematic cross sectional view of a portion of an OLED-on-CMOS structure at one stage of the fabrication according to a first embodiment of the present invention.

According to the first embodiment, as shown in FIG. 1, a wafer 101 having an integrated circuit (not shown) is provided. The wafer 101 is a silicon wafer, for example. The integrated circuit is fabricated with CMOS technology in one example. A photo-resist 102 is then formed on the top of the wafer 101, initially as a continuous layer (not shown). A photolithographic process is then employed to define pixel areas 105, as shown in FIG. 1, for forming pixel electrodes (or metal layer(s)). The photo-resist thickness is 3000 angstroms (300 nm), for example. The photo-resist remains in areas which later on are referred to as pixel gaps 106 (FIG. 3).

Figure 2:
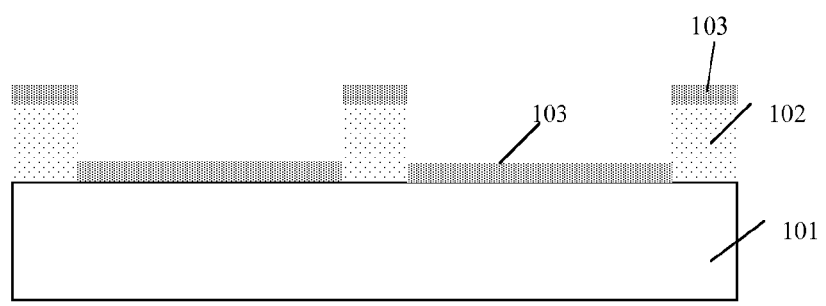
FIG. 2 shows a schematic cross sectional view of a portion of an OLED-on-CMOS structure at a second stage of the fabrication according to the first embodiment of the present invention.

As shown in FIG. 2, a metal layer 103 is then formed in the pixel areas 105 on the wafer 101. The metal layer 103 is also formed on top of the photo-resist 102. The thickness of the metal layer 103 is 500 angstroms, for example. Various suitable metallic materials such as aluminium, titanium, tantalum, silver, titanium nitride or others may be used to fabricate the metal layer 103. In one embodiment, the metal layer consists of multi-layers of Al film of 40 nanometers and titanium nitride of 10 nanometers. The metal formation is preferably carried out at a low temperature to reduce the risk of photo-resist burn out. In one example, the metal layer 103 is formed by a PVD process, at a deposition temperature of about 150 degree C.

Figure 3:
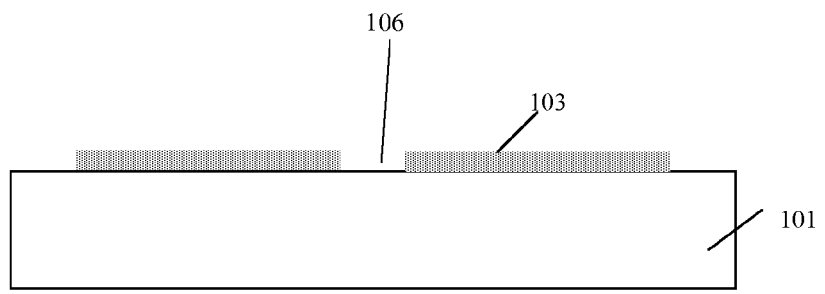
FIG. 3 shows a schematic cross sectional view of a portion of an OLED-on-CMOS structure at a third stage of the fabrication according to the first embodiment of the present invention.

As shown in FIG. 3, the metal layer 103 and the photo-resist 102 of FIG. 2 are then removed from the pixel gaps 106, for example using an acetone solution. It will be appreciated that a chemical solution other than an acetone solution can instead be used to remove the photo-resist. The chemical solution removes the photo-resist effectively without reacting with the metal electrodes.

Removing the photo-resist using a chemical solution constitutes a first lift-off process. As a result, the metal layers 103 in the form of the metal pixel electrodes 103 on the wafer 101 are patterned, as shown in FIG. 3. In one example, the acetone solution is applied at about 50 degree C. Optionally, a megasonic is applied, either at the same time as the chemical solution, or thereafter, to help with the removal of the photo-resist.

A further sequence of manufacturing steps, according to the second embodiment, will now be described with reference to FIGS. 4 to 8. The structure shown in FIG. 4 may for example be obtained as explained with reference to FIGS. 1, 2 and 3. As a result, in FIG. 4, the pixel electrodes 103 are patterned, which corresponds to the third stage of the process of FIG. 3.

Figure 5:
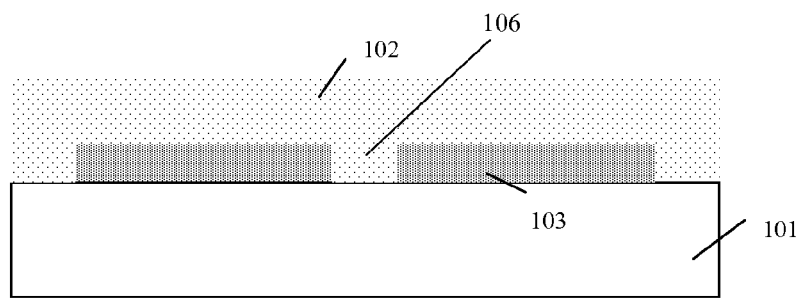
FIG. 5 shows a schematic cross sectional view of a portion of an OLED-on-CMOS structure at a second stage of the fabrication according to the second embodiment of the present invention.

As shown in FIG. 5, photo-resist 102 is subsequently formed on top of the wafer 101 and pixel electrodes 103. The cross sectional view after formation of the photo-resist 102 is shown in FIG. 5. Some portions of the photo-resist 102 are formed in the pixel gap 106 on the wafer 101, whereas some portions of the photo-resist 102 are formed on the pixel electrodes 103. In one example, the photo-resist thickness is 4000 angstroms.

Figure 6:
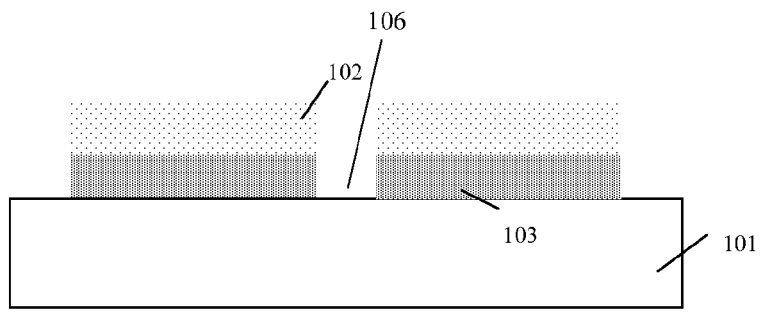
FIG. 6 shows a schematic cross sectional view of a portion of an OLED-on-CMOS structure at a third stage of the fabrication according to the second embodiment of the present invention.

As shown in FIG. 6, a photolithographic process is then employed to remove the photo-resist 102 in the gap 106 between the pixel electrodes 103.

Figure 7:
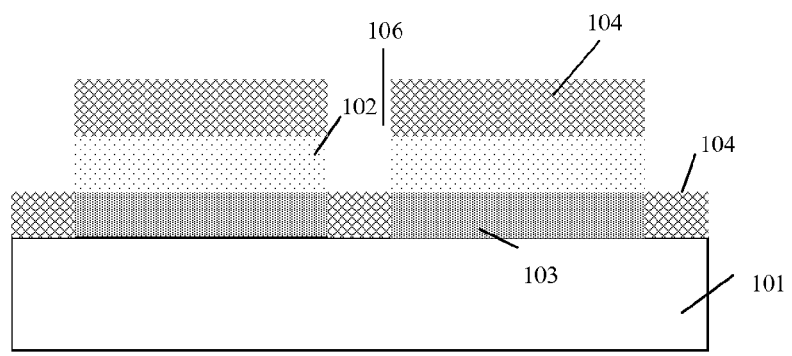
FIG. 7 shows a schematic cross sectional view of a portion of an OLED-on-CMOS structure at a fourth stage of the fabrication according to the second embodiment of the present invention.

As shown in FIG. 7, an insulating dielectric layer 104 is then formed on top of the wafer 101. Some portions of the insulating layer 104 are formed in the pixel gap 106 directly on the wafer 101 and some portions of the insulating layer 104 are formed on the photo-resist 102. In one example of the insulating dielectric layer 104, a silicon nitride layer of 500 angstroms is formed by a reactive magnetron sputtering process at room temperature. In this example, silicon is sputtered by argon and nitrogen ions at 200 W to 400 W with 0.1 to 1 Pa pressure.

Figure 8:
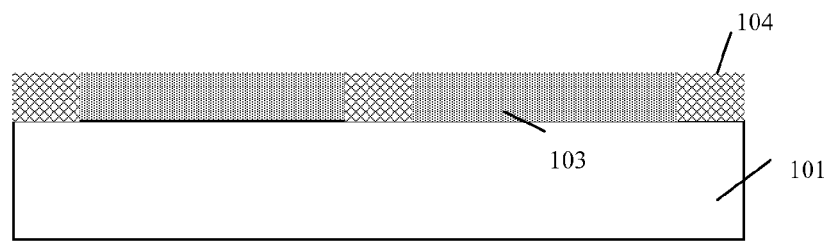
FIG. 8 shows a schematic cross sectional view of a portion of an OLED-on-CMOS structure at a fifth stage of the fabrication according to the second embodiment of the present invention.

As shown in FIG. 8, the dielectric insulating layer 104 and photo-resist 102 on the pixel electrodes 103 are then removed by hot acetone. This constitutes a second lift-off process. In one example, an additional plasma ashing process is applied to further remove remaining photo resist from the top of metal layers 103.

An additional plasma ashing process can also be carried out after, or as part of, the first lift-off process.

The sequence of manufacturing steps as described with reference to FIGS. 1-3 can be performed, pursuant to the invention, independently from the manufacturing steps described with reference to FIGS. 4-8. For example, according to FIGS. 1-3, the photo-resist 102 and the material 103 on the photo-resist 102 (which material is the same as the material from which pixel electrodes 103 are made, see FIG. 2), can be removed using the lift-off process (FIG. 3), but the manufacturing process then does not follow FIGS. 4-8 but instead uses a plasma etching process to result in a product similar to that shown in FIG. 8.

Figure 4:
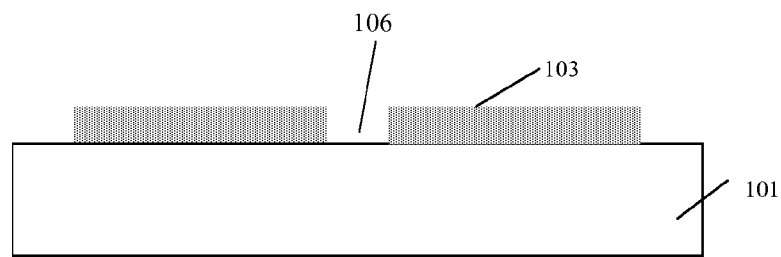
FIG. 4 shows a schematic cross sectional view of a portion of an OLED-on-CMOS structure at a first stage of the fabrication according to a second embodiment of the present invention.

Conversely, instead of following the steps of FIGS. 1-3, a different process (e.g. using plasma etching) can be used to result in a structure similar to that shown in FIG. 4. The manufacturing process then proceeds as per FIG. 4-8, i.e. the photo-resist 102 and the dielectric material 104 on top of the photo-resist 102 (FIG. 7) can be removed by the lift-off process in accordance with the present invention.

Whilst much of the above description has made reference to a lift-off process, it will be appreciated by one skilled in the art that it is conceivable to use a solvent and/or a solution (so as to remove photo-resist and a material on top of the photo-resist) under conditions other than ones which would normally be used as part of a lift-off technique.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims.

Each feature disclosed or illustrated in the present specification may be incorporated in the invention, whether alone or in any appropriate combination with any other feature disclosed or illustrated herein.

What is claimed is:

1. A method of forming an OLED comprising at least two pixel electrodes defining at least one pixel gap therebetween, wherein the method comprises:
    depositing a photo-resist in the at least one pixel gap and on the pixel electrodes;
    photolithographically patterning the photo-resist so that the photo-resist is located substantially on the surface of the pixel electrodes and to substantially remove the photo-resist from the pixel gap;
    depositing a dielectric material in the pixel gap and on the photo-resist located on the pixel electrodes; and
    performing a lift-off process comprising removing a material from on top of the at least two pixel electrodes, wherein the material comprises the photo-resist and the dielectric material on top of the photo-resist, and wherein the dielectric material is the same material as a material located in the at least one pixel gap.

2. The method according to claim 1, further comprising:
    providing a substrate with the at least two pixel electrodes formed thereon, the at least one pixel gap being formed between two adjacent electrodes.

3. The method according to claim 2, wherein depositing the dielectric material in the pixel gap comprises substantially filling the pixel gap.

4. The method according to claim 3, wherein the lift-off process ensures that substantially none of the surface of the pixel electrodes is covered by the photo-resist.

5. The method according to claim 3, further comprising applying a plasma ashing process to substantially remove any remaining photo-resist from the surface of the pixel electrodes.

6. The method according to claim 2, wherein the method results in the level of the surface of the pixel electrodes being substantially the same as the level of the surface of the dielectric material in the pixel gap.

7. A method of forming an OLED comprising at least two pixel electrodes defining at least one pixel gap therebetween, wherein the method comprises:
    depositing a photo-resist in the at least one pixel gap and on the pixel electrodes;
    photolithographically patterning the photo-resist so that the photo-resist is located substantially on the surface of the pixel electrodes and to substantially remove the photo-resist from the pixel gap;
    depositing a dielectric material in the pixel gap and on the photo-resist located on the pixel electrodes; and
    performing a lift-off process to remove the dielectric material and the photo-resist on top of the at least two pixel electrodes so as to result in the level of a surface of the pixel electrodes being substantially the same as the level of a surface of the dielectric material in the pixel gap.

* * * * *